United States Patent [19]
Lu

[11] Patent Number: 6,161,118
[45] Date of Patent: Dec. 12, 2000

[54] DIGITAL COMB FILTER HAVING A CASCADED INTEGRATOR STAGE WITH ADJUSTABLE GAIN

[75] Inventor: Jinghui Lu, Austin, Tex.

[73] Assignee: Oak Technology, Inc., Sunnyvale, Calif.

[21] Appl. No.: 09/096,782

[22] Filed: Jun. 12, 1998

[51] Int. Cl.[7] ............................... G06F 5/00; G06F 17/10
[52] U.S. Cl. ........................... 708/313; 708/208; 708/444
[58] Field of Search .................................. 708/313, 208, 708/444

[56] References Cited

U.S. PATENT DOCUMENTS

| | | | |
|---|---|---|---|
| 4,872,129 | 10/1989 | Pfeifer et al. | 708/313 |
| 4,983,966 | 1/1991 | Grone et al. | 708/208 |
| 5,043,933 | 8/1991 | Boutaud et al. | 708/313 |
| 5,592,517 | 1/1997 | Camp et al. | 708/313 |
| 5,689,449 | 11/1997 | Saramäki et al. | 708/313 |
| 5,732,002 | 3/1998 | Lee et al. | 708/313 |
| 5,880,973 | 3/1999 | Gray et al. | 708/313 |
| 5,956,494 | 9/1999 | Girardeau, Jr. | 708/208 |

OTHER PUBLICATIONS

Chu et al., "Multirate Filter Designs Using Comb Filters," *IEEE Transactions on Circuits and Systems*, vol. CAS–31, No. 11, Nov. 1984, pp. 405–416.

*Primary Examiner*—David H. Malzahn
*Attorney, Agent, or Firm*—Kevin L. Daffer; Conley, Rose & Tayon

[57] ABSTRACT

A comb filter is provided for achieving substantial attenuation of aliasing or imaging bans of a signal to be filtered. The comb filter can perform decimation or interpolation, depending upon its application. Integration can include an integration term with adjustable voltage accumulation at a particular sample point in time. The accumulation factor can be an integer or fractional number and is introduced at a sample count value L within each of M number of samples formed by the rate change switch within the comb filter. The amount of gain being introduced can possibly vary depending on the number of accumulation cycles programmed within configuration registers of the digital signal processor which carries out the comb filter functions. The programmable accumulator avoids having to implement a multiplication operation and the complexities associated therewith.

21 Claims, 3 Drawing Sheets

DIGITAL COMB FILTER HAVING A CASCADED INTEGRATOR STAGE WITH ADJUSTABLE GAIN

BACKGROUND OF THE INVENTION

1. Field of the Invention

This invention relates to a system for filtering a digital signal and, more particularly, to a digital comb filter which can introduce programmable gain within the filtered digital signal.

2. Description of the Related Art

A microprocessor or microcontroller can be called upon to perform numerous applications, one of which is referred to as digital signal processing ("DSP"). DSP applications are diverse in nature and are comprised of basically three hardware elements or software instructions: multiplication, summing, and delay. These elemental operations must be performed many times for each sample of the incoming signal. Accordingly, a DSP operation presumes that the incoming signal is sampled at relatively equal-spaced intervals within a time domain.

Complex DSP operations can be derived from the basic operational elements to perform applications useful in audio processing, such as reverberation, equalization, compression, limiting and noise reduction. Of benefit is that the basic operational elements can achieve functions far more complex than that achieved by analog circuitry. For at least this reason, analog signals are often converted to digital signals so that complex manipulations can be more readily achieved in real-time.

Summing and delay are operations which are more easily performed than multiplication. Multiplication can be used to implement a multiplier gain upon an incoming digital signal. An execution unit which performs an accumulation function, and a summing function coupled with delay, can be more easily implemented than multiplication. It is therefore of benefit that a DSP implementing noise reduction (i.e., digital filtering) utilizes mostly summing and delay structures (or instructions) rather than the more complex multiplier structures. Partially for this reason, comb filters have enjoyed extensive use as a DSP application.

A typical comb filter is one having an integrator separated from a differentiator by a rate change switch. Depending on whether the rate change switch performs decimation or interpolation, the integrator can be placed either before the rate change switch or after the rate change switch. In the latter instance, the comb filter is said to have been implemented as a comb interpolation filter, whereas the former instance results in a comb decimation filter.

FIG. 1 illustrates two types of comb filter, a comb decimation filter 10a and a comb interpolation filter 10b. Filter 10a receives a digital bit stream $D_{IN}$ from possibly an analog-to-digital converter and places that digital bit stream into an $N^{th}$ order integrator 12. Sample rate reduction by factor M is achieved by a decimation switch 14 prior to introducing the lower sample rate into an $N^{th}$ order differentiator 16. Similar to comb decimation filter 10a, comb interpolation filter 10b receives the digital bit stream $D_{IN}$. $D_{IN}$ is, however, received upon an $N^{th}$ order differentiator 18 and, prior to forwarding the differentiated output to an $N^{th}$ order integrator 20, an increase in sample rate occurs via interpolation rate change switch 22.

An overview of comb filters in general and the filter transfer function of various stages of a comb filter is set forth in Chu, et al. *Multirate Filter Designs Using Comb Filters* (IEEE Trans. Circuits and Systems), pp. 405–416 (herein incorporated by reference). It is generally known that the transfer function of an $N^{th}$ order comb filter can be represented as:

$$H(z) = \left(\frac{1-z^{-M}}{1-z^{-1}}\right)^N \quad \text{(Eq. 1)}$$

The transfer function of equation 1 is set forth in a frequency domain, where M represents the rate change factor, N equals the number of orders, and z is equivalent to $e^{-jw}$ in the frequency domain. It is known that j is an imaginary number and w represents a phase $2_\pi f$.

FIG. 1 indicates that one order of comb interpolation filter 10b can be realized as a sample and hold switch 24. A new comb interpolation filter 10c will result having one order reduction within both differentiator 18a and interator 20a. Removing one differentiator and one integrator, and placing the combined differentiator and integrator (comb filter) within sample and hold switch 24 helps minimize the overall complexity of the resulting comb interpolation filter 10c.

Shown in FIG. 2 are structural components which make up the exemplary comb interpolation filter 10c. Specifically, N−1 orders of differentiator 18a are linked to N−1 orders of integrator 20a by the sample and hold switch 24. Orders can often be thought of as distinct operations or "terms." A term is therefore said to embody a single or combination of hardware elements or software instructions. Of benefit to a comb filter is that each term involves one delay element 26 and one add element 28 connected together in feed forward or feed back arrangement. Therefore, a multiplication operation need not be performed to carry out a comb filter operation. If connected in feed forward with a negative add at the sum terminal, the term is said to represent a differentiator. If connected in feed back with a positive add at the sum terminal, the term represents an integrator.

Comb filters, in addition to their less complex nature, achieve superior roll-off characteristics. Higher frequencies naturally receive greater attenuation than lower frequencies. The roll-off benefits are particularly favorable when a comb filter is used as a low pass filter to remove oversampling quantizer noise. Since the lower frequency range is where the comb filter attenuation is lessened, if aliasing or imaging errors occur, they are most likely to occur at the lowest frequency range of the first (or lowest) aliasing or imaging band.

As attenuation requirements become more substantial, the comb filter structure must take on additional orders within its structure. As used above, and defined herein below, an "order" refers to a term needed to employ the filter. FIG. 2 indicates that comb interpolation filter 10c receives a lower frequency digital bit stream having data rate fs and interpolates that signal by a factor M to achieve an increased data rate Mfs. Of course, numerous bit streams beyond bit0 can be filtered, each of which generally utilizes one or more terms of a differentiator separated by one or more terms of an integrator and having a rate change switch interposed between the differentiator and integrator terms.

Partially due to its avoidance of many complex multiplication operations and/or terms, a comb filter is generally constrained to a fixed DC gain arising within the filter. This is better illustrated by reducing the equation 1 transfer function to an equivalent transfer function shown in equation 2, as follows:

$$H(z)=[1+z^{-1}+z^{-2}+z^{-3}+\ldots+Z^{-(M-1)}]^N \quad \text{(Eq.2)}$$

Given that $z=e^{-j0}$, w will equal zero at DC, and $e^{-jw}$ will reduce to 1, making the equation 2 representation of magnitude appear at DC or steady state, as follows:

$$|H(z)|_{DC}=[1+1+1+1+ \ldots 1]^N=M^N \qquad (Eq.3)$$

The DC gain achieved by a single stage comb filter can therefore be represented as $M^N$, and therefore dependent solely on the rate change factor M and the number of orders N. A change of the DC gain will require changing M or N with little, if any, flexibility in doing so.

It would be desirable to introduce a comb filter with a programmable DC gain. The programmable gain should be one which can vary depending on the application so that, for example, the filtered output can be increased (or decreased) in magnitude whenever the receiving device is insensitive (or sensitive) to digital voltage changes. That is, the gain is scalable to the receiving device's capabilities. A flexible methodology by which DC gain can be varied to meet any suitable receiver or transmitter would therefore be a benefit in a broad variety of DSP applications with fixed M and N filter values.

SUMMARY OF THE INVENTION

The problems outlined above are in large part solved by a comb filter which implements programmable and variable DC gain. The comb filter includes an additional term, the output of which is a quantifiable voltage magnitude induced upon the digital signal at a time in which at least one sample of that signal is taken. The additional term is interchangeably referred to as a "stage" or "branch." Output from the additional term is summed within an output of a prior integrator term. Accordingly, the additional term is an integrator term, and is therefore implemented within the integrator section of the comb interpolation or decimation filter.

According to one embodiment, the additional term is a second stage of the integrator, wherein the second stage adds the gain factor to one sample within M number of samples taken of the digital signal presented to the integrator. A preceding first stage receives the M samples and accumulates L−1 number of samples. The additional, second stage is coupled to this first stage for adding the gain factor to the accumulated L−1 number of samples at a time in which sample L occurs.

According to another embodiment, the gain factor is an integer multiple, or a fraction, of the digital signal magnitude recorded during one of the M number of samples taken of the digital signal. A configuration register may be configured upon start up, boot or reset of the DSP embodying the comb filter or integrator hereof. The configuration register may contain a set of bits which determine where, within the M number of samples, the L sample resides. The configuration register may also determine the magnitude of the gain factor (i.e., whether the gain factor is an integer multiple of a digital signal magnitude recorded during a sample time, or whether the gain factor is a fraction of that magnitude).

According to yet a further embodiment, a method is introduced for providing gain to a filtered digital bit stream. Magnitudes of a digital signal are sampled at periodic intervals at sample times L−1, and samples taken at times L−1 are accumulated and combined with a gain factor induced at sample time L. Magnitudes can thereafter be further sampled at and added to the previous sampled magnitudes at times subsequent to L (i.e., at sample time L+1, L+2 . . . M).

BRIEF DESCRIPTION OF THE DRAWINGS

Other objects and advantages of the invention will become apparent upon reading the following detailed description and upon reference to the accompanying drawings in which.

Figure 1:
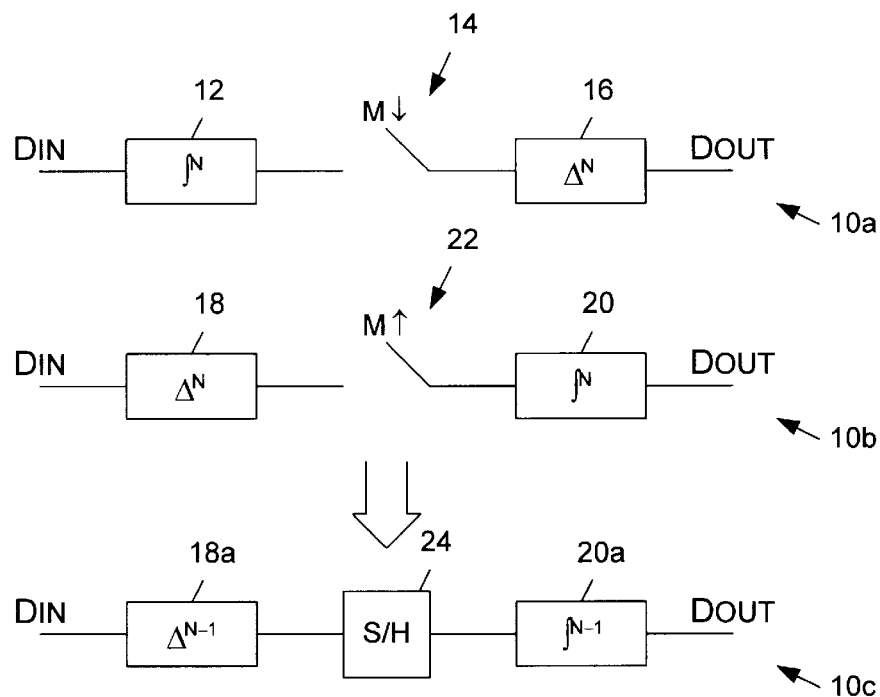
FIG. 1 is a block diagram of a multiple order comb filter implemented with either a decimation or interpolation rate change switch configured between a differentiator and an interpolator.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
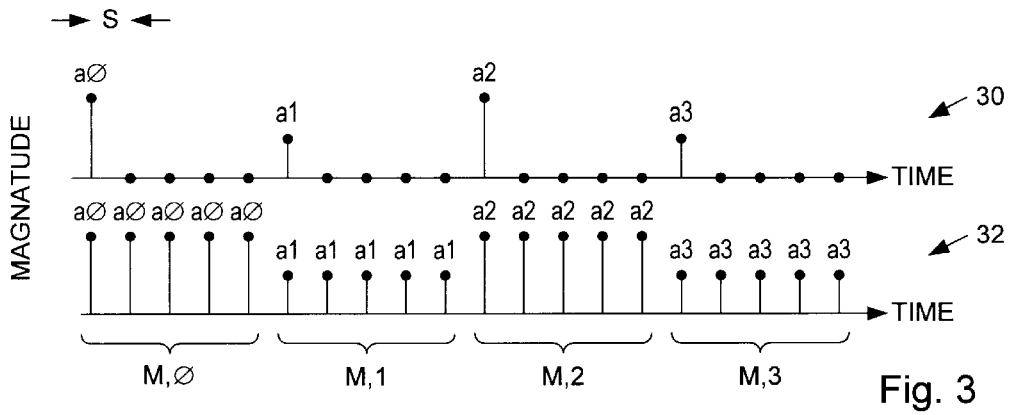
FIG. 3 are graphs of a digital signal sampled by an interpolation switch, or an sample-and-hold interpolation switch, which samples M times for each session a0, a1, a2, a3, etc.

Referring to FIG. 3, graph 30 indicates periodic insertion of zeros within a digital signal. The zero points occur at a regular interval s. Graph 30 indicates the magnitude at time 0 to present a0. The same digital signal may be re-sampled at a faster rate than the transitory rate of the digital signal using interpolation techniques described above. Graph 30 indicates that only certain inputs a0, a1, a2, and a3 occur, with zero points inserted between each input.

Figure 2:
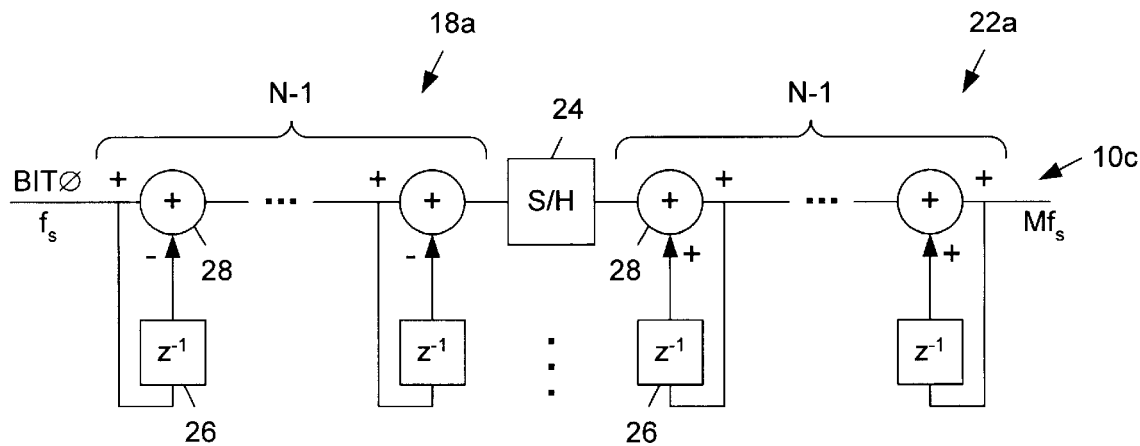
FIG. 2 illustrates structural components of the multiple comb filter realized as a N−1 order differentiator, followed by a sample-and-hold interpolation switch, further followed by a N−1 order integrator.

A sample and hold rate change switch and, particularly, a sample and hold interpolation switch such as that shown in FIGS. 1 and 2 maintains voltage values at sample points beyond a0, a1, a2, and a3 as shown by graph 32. In fact, each sample point within M number of samples is held as an output from the sample and hold interpolation switch. Graph 32 indicates that a digital voltage value is sampled and maintained M number of times for numerous sessions labeled in FIG. 3 as session 0, session 1, session 2, and session 3. Alternatively, session 0 can be labeled as session 1 and subsequent sessions 1, 2, and 3 and be labeled as session o, p, etc. as will be evident from the following equations which describe integration in a time domain.

Figure 4:
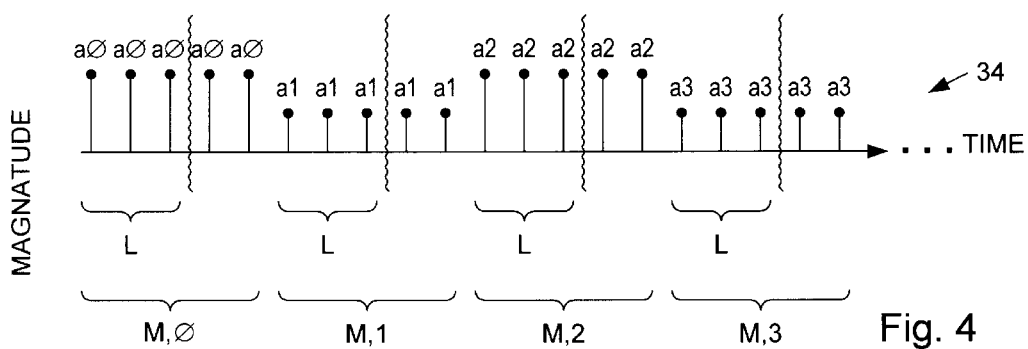
FIG. 4 is a graph of samples taken prior to a count L, and samples taken after count L each session of M samples.

FIG. 4 illustrates a sample and hold interpolation switch outcome 34, wherein sampled and held amplitudes a0, a1, a2, and a3 are bifurcated into points less than sample count L and points greater than sample count L for each set of M samples and within each session 0, 1, 2, and 3. In the example provided, three sample points occur before count L, and two sample points occur after count L for a sample and hold integration switch having a rate change factor of M=5. The benefits of denoting sampled magnitudes less than time L and after sample time L is better illustrated in reference to FIG. 5.

Figure 5:
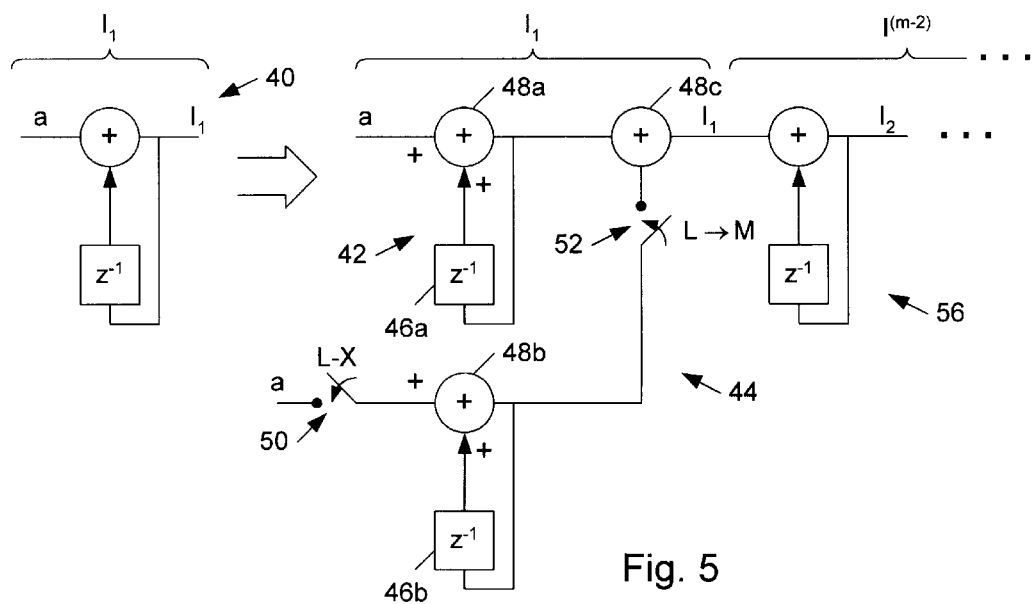
FIG. 5 illustrates structural detail of a single order integrator bifurcated into cascaded stages, each of which accumulates a pre-defined number of samples before count L, during count L and after count L for each sequence of M samples.

FIG. 5 illustrates structural details of a conventional single order integrator 40 converted into a pair of cascaded stages 42 and 44 which represent, in part, a benefit of the present invention. Accordingly, a single order integrator $I_1$ is formulated into two stages, each of which involve a delay element 46a and 46c coupled in feedback with an adder 48a and 48b.

A gain stage 44, as well as first stage 42 (of staged pair 42 and 56) essentially receives a digital signal of varying amplitude a, and integrates that signal. More specifically, stage 44 is used solely to introduce gain X on the $L^{th}$ sample of the incoming digital signal amplitudes a. Stage 42 accumulates (i.e., integrates) amplitudes a as follows, if M=5 and L=3:

| Input Sequence | a0 | | | | | a1 | |
|---|---|---|---|---|---|---|---|
| S/H Output | a0 | a0 | a0 | a0 | a0 | a1 | a1 |
| First Stage Output | a0 | 2a0 | 3a0 | 4a0 | 5a0 | 5a0 + a1 | 5a0 + 2a1 |

The output from first stage 42 serves merely to accumulate sample and hold input from a sample and hold switch, and therefore first stage 42 represents the first set of operations performed by an integrator block of a comb filter hereof. It is not until after time L occurs that gain is introduced at that sample position.

Gain stage 44 can be implemented in numerous ways, one of which is shown in FIG. 5. Components 46b and 48b accumulate several samples preferably before sample count L arrives (i.e., the count immediately preceding time L). The number of samples can be programmed as described below. FIG. 5 illustrates the programmed sample count as reference numeral X. Accumulation of X samples can be achieved, for example, by closing a switch 50 X number of sample points prior to time L. Components 46b and 48b accumulate multiple samples so that the accumulated magnitude is presented when the $L^{th}$ sample occurs. Switch 52 may be used to forward the accumulated samples representative of a desired gain upon sum node 48c. Merely as an example, switch 52 closes at sample count L to forward the accumulated X samples to sum node 48c. This causes a summation of the accumulated gain value with the prior-accumulated digital signal magnitudes at sample time L. If, for example, M=5, L=3, and gain factor X=2, the time sequence from second stage $I_1$ is as follows:

Second Stage Output ($I_1$): a0 2a0 3a0 6a0 7a0 7a0+a1 7a0+2a1 . . . , where a gain of 3 is realized at sample time L.

Figure 6:
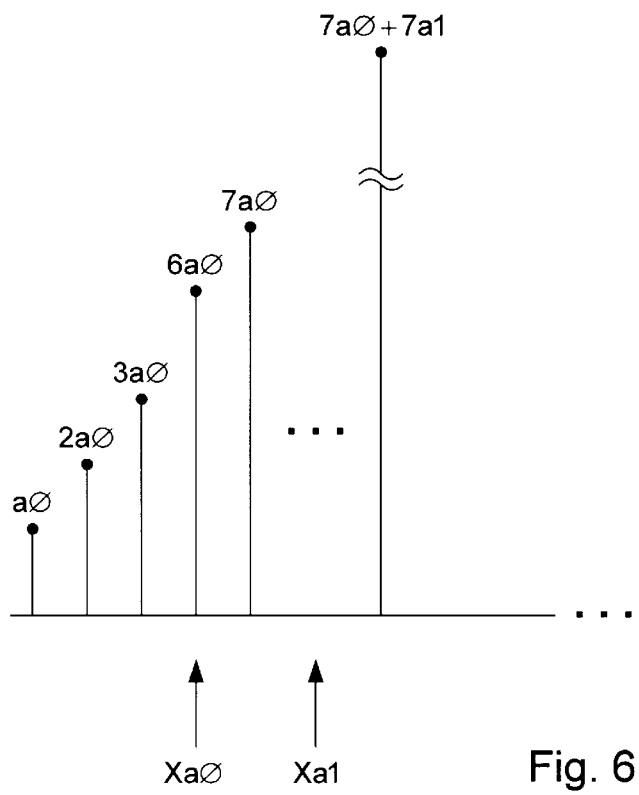
FIG. 6 is a graph of accumulated samples of integrator $I_1$ stages, with gain induced during count L of each set of M samples.

FIG. 6 illustrates in more detail the staged integration through $I_1$ output for the sample where M=5, L=3, and X=2. Providing gain to sample L, where L is less than M, establishes a range of numbers that could be used in conjunction with other system gain compensation to increase the system gain compensation capability of the digital comb filter. Furthermore, by having a gain term X, an extra multiply operation can be avoided. Instead, the additional gain can be implemented merely with an add and delay element coupled in feedback (successive accumulation) rather than using a more complex multiplication gain factor.

Detail regarding the significance of adding a gain factor X at a sample position L is best illustrated referencing FIG. 5 and the time domain transfer function for $I_1$:

$$I_1(j) = \begin{cases} \left[\left(\sum_{j=L}^{M-1} a\right) + Xa + La\right], & j \geq L \\ \sum_{j=0}^{L-1} a, & j \leq L \end{cases} \quad \text{(Eq. 4)}$$

The output from stages 42 and 44 at sample numbers j less than L is represented merely as a summation of digital signal amplitudes a at sample position zero to L−1. However, the output from stages 42 and 44 at sample positions greater than L, is represented as a combination of samples up to L (i.e., the product of L and a), samples at the sample position L (i.e., the product of X and a), and the samples following sample position L. The samples following position L result as the summation of amplitudes a from sample position L to the cumulative number of samples M−1 within each session. Note that the integrator block total number of samples using a sample and hold interpolation switch is equal to M−1 rather than M as described above.

A M−1 order integrator block can therefore be realized as a $I_1$ integrator block followed by a $I^{n-2}$, as shown in FIG. 5. This means that the cumulative integration by the integrator block is represented as $$I = (I^{N-2})(I_1) = h(n, j) = \sum_n \sum_p \cdots \sum_l (I_1) \quad \text{(Eq. 5)}$$

Equation 5 illustrates in time domain multiple orders n, p . . . 1 summation of a pre-existing integration $I_1$ derived from stages 42 and 44 in FIG. 5. When combined with the differentiator portion of a comb filter, a frequency domain transfer function having an integrator section with an equivalent time domain function as that set forth in equation 5, is represented in the following equation 6:

$$H(z) = \left(\frac{M+X}{M}\right)\left(\frac{1-z^{-M}}{1-z^{-1}}\right)^N \quad \text{(Eq. 6)}$$

During times when steady state condition (i.e. DC) occurs, the $1-z^{-M}/1-z^{-1}$ component reduces to M leaving the following equation representative of DC gain:

$$|H(z)|_{DC} = \left(\frac{M+X}{M}\right)M^N = M^{N-1}(M+X) \quad \text{(Eq. 7)}$$

As seen in equation 7, DC gain can be varied by factor X. The (M+X)/M factor introduces fractional gain to the original DC gain $M^N$.

Of importance is a programmable fractional or integer change of original DC gain which can be achieved without having to implement an additional multiplication operation. The mechanism for programming the gain factor X and the relative sample position L is described in FIG. 7, according to one example.

Figure 7:
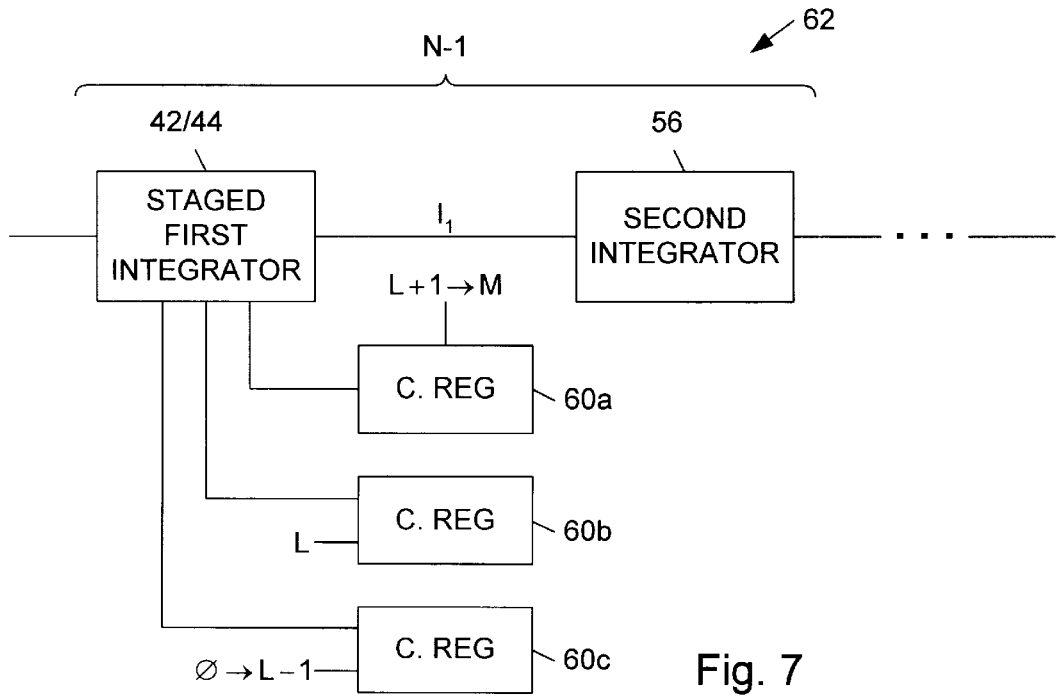
FIG. 7 is a block diagram of the integrator portion of the comb filter set forth in FIG. 1, wherein registers are configured during reset of a digital signal processor embodying the comb filter for controlling accumulation within each stage of the staged first integrator in FIG. 5.

FIG. 7 illustrates a staged first integrator 42/44 configured to receive output from one or more configuration registers 60. Configuration register 60 exists within the DSP to perform the comb filtering operation. More specifically, during reset or boot up of the processor or execution unit embodying the DSP, the I/O address space is accessed and the configuration registers are polled and written to. For example, configuration register 60 can be configured with binary bits representing a count L and a count X. Count L determines where, within the sample counts, gain will be introduced, and count X determines the amount of gain. Configuration region 60*a* can be programmed with count X, and configuration register 60*b* can be configured with the count L (noted as the count value immediately after which a gain is introduced).

It would be appreciated by those skilled in the art having the benefit of this disclosure that the comb filter or the method thereof is believed to be capable of applications in which noise can be reduced within a specific frequency range, and that noise is reduced with minimal hardware or software overhead. Importantly, noise is reduced while a variable DC gain is applied to the filtered output. It is also to be understood that the invention shown and described is to be taken as presently preferred embodiments. Various modifications and changes may be made to the design structure to optimize the term count and the overall filter composition as would be obvious to a person skilled in the art having the benefit of this disclosure. The specification and drawings are therefore to be regarded in an illustrative rather than a restrictive sense.

What is claimed is:

1. An integrator, comprising a stage within the integrator for adding a gain term to one sample within a series of samples taken of a digital signal forwarded to the integrator.

2. The integrator as recited in claim 1, wherein the gain term is an integer multiple of a magnitude of the digital signal sampled during said one sample within said series of samples.

3. The integrator as recited in claim 1, wherein the gain term comprises a fraction of a magnitude of the digital signal sampled during said one sample within said series of samples.

4. The integrator as recited in claim 1, wherein said series of samples and said gain term are accumulated at the output of at least two stages of the integrator.

5. The integrator as recited in claim 1, further comprising a configuration register containing a set of bits for determining where within the series of samples said one sample resides.

6. An integrator, comprising:
   a first stage coupled to accumulate L−1 number of samples within a series of M samples taken of a digital signal, where L is less than M; and
   a second stage coupled to the first stage for adding a gain term to the accumulated L−1 number of samples.

7. The integrator as recited in claim 6, wherein each of the first and second stages comprise an adder and a delay element coupled in feedback from an output of the adder to an input of the adder.

8. The integrator as recited in claim 6, wherein an output of the first stage is coupled to an input of the second stage.

9. The integrator as recited in claim 6, wherein the gain term is an integer multiple of a magnitude of the digital signal sampled during one of said M samples.

10. The integrator as recited in claim 6, wherein the second stage is further coupled to add the gain term to the accumulated L−1 number of samples subsequent to the time in which an $L^{th}$ sample occurs up to and including an $M^{th}$ sample of said series of M samples.

11. The integrator as recited in claim 6, wherein said adding occurs when an $L^{th}$ sample is received by the first stage.

12. A comb filter, comprising:
    a differentiator;
    a rate change switch; and
    an integrator operably coupled to the differentiator by the rate change switch,
    wherein the integrator includes a stage for adding a gain term to at least one sample within a series of samples taken of a signal forwarded to the integrator.

13. The comb filter as recited in claim 12, wherein the gain term is an integer multiple of a magnitude of the digital signal sampled during said one sample within said series of samples.

14. The comb filter as recited in claim 12, wherein the rate change switch retains a magnitude of the digital signal for each of the samples within the series of samples taken.

15. The comb filter as recited in claim 12, wherein the gain term is added subsequent to an initial set of samples within each of the series of samples.

16. The comb filter as recited in claim 12, wherein the rate change switch comprises a sample and hold switch.

17. The comb filter as recited in claim 16, wherein said series of samples arises from the sample and hold switch.

18. The comb filter as recited in claim 12, wherein the gain factor comprises a fraction of a magnitude of the digital signal sampled during said one sample of said series of samples.

19. A method for inducing gain upon a digital signal, comprising:
    accumulating magnitudes of the digital signal at L−1 sample times;
    combining the accumulated magnitudes with a gain term at a subsequent sample time L; and
    accumulating further magnitudes of the digital signal subsequent to the L−1 sample times.

20. The method as recited in claim 19, wherein said combining comprises adding the accumulated magnitudes with a value substantially equal to an integer multiple of one of the accumulated magnitudes.

21. The method as recited in claim 19, wherein said combining comprises adding the accumulated magnitudes with a value substantially equal to a fraction of one of the accumulated magnitudes.

* * * * *